United States Patent [19]

Murakami

[11] Patent Number: 4,819,044
[45] Date of Patent: Apr. 4, 1989

[54] VERTICAL TYPE MOS TRANSISTOR AND ITS CHIP

[75] Inventor: Koichi Murakami, Yokosuka, Japan

[73] Assignee: Nissan Motor Co., Ltd., Kanagawa, Japan

[21] Appl. No.: 826,772

[22] Filed: Feb. 6, 1986

[30] Foreign Application Priority Data

Feb. 8, 1985 [JP] Japan .................................. 60-21813

[51] Int. Cl.⁴ ............................................. H01L 29/78
[52] U.S. Cl. ................................ 357/23.4; 357/23.13; 357/23.8; 357/13
[58] Field of Search ................... 357/23.4, 23.8, 23.13, 357/13, 68

[56] References Cited

U.S. PATENT DOCUMENTS

| | | | |
|---|---|---|---|
| 4,345,265 | 8/1982 | Blanchard | 357/23.4 |
| 4,399,449 | 8/1983 | Herman et al. | 357/23.8 X |
| 4,484,206 | 11/1984 | Moroshima et al. | 357/13 X |
| 4,532,534 | 7/1985 | Ford et al. | 357/23.4 |
| 4,608,584 | 8/1986 | Mihara | 357/23.4 |
| 4,631,564 | 12/1986 | Neilson et al. | 357/23.4 |
| 4,686,551 | 8/1987 | Mihara | 357/23.4 |

FOREIGN PATENT DOCUMENTS

| | | | |
|---|---|---|---|
| 0037105 | 10/1981 | European Pat. Off. | 357/23.8 |
| 59-149056 | of 0000 | Japan | 357/234 |
| 57-206073 | 12/1982 | Japan | 357/23.4 |

Primary Examiner—Andrew J. James
Assistant Examiner—Sara W. Crane
Attorney, Agent, or Firm—Foley & Lardner, Schwartz, Jeffery, Schwaab, Mack, Blumenthal & Evans

[57] ABSTRACT

A vertical type MOS transistor and its chip comprise at least one MOS transistor portion consisting of a semiconductor layer having at least a first P-N junction, sandwiched by a source electrode through an insulating layer and a drain electrode, and a Zener diode portion having a second P-N junction formed in parallel with and adjacent to the MOS transistor portion in said semiconductor layer, the conductive level of said second P-N junction of the diode portion being lower than that of the first P-N junction of the transistor portion. With this construction, when a large surge voltage above a predetermined breakdown point of the Zener diode portion is applied to the source and drain electrodes, the Zener diode portion is first rendered conductive and any breakdown of the MOS transistor portion can be prevented.

3 Claims, 3 Drawing Sheets

VERTICAL TYPE MOS TRANSISTOR AND ITS CHIP

BACKGROUND OF THE INVENTION

(1) Field of the Invention

The present invention relates to an improved vertical type MOS transistor for preventing destruction of the transistor element or elements, and its chip from a surge voltage of current.

(2) Description of the Prior Art

The vertical type MOS transistor is useful as a power switching element and it has many applications. One example of the vertical type MOS transistor is described in a monthly magazine "ELECTRONICS", June volume, p. 587, 1982 issued by Ohm Publishing Co., Ltd.

FIG. 4 shows a cross-sectional view of the vertical type N-channel MOS transistor of the type according to the prior art. The vertical type MOS transistor consists of a N+- type substrate 1, a N-type drain region 3 formed thereon, a plurality of P-type well regions 9 formed by impurity diffusion in the N-type drain region 3, with a predetermined distance spaced apart, and N+-type source regions 11 and a P+type well contact region 13 sandwiched between the N+- type source regions, all of the substrate 1 and the different regions being electrically conductive and the N+- type source regions 11 and the P+-type well contact region 13 being formed by impurity diffusion in each P-type well region 9 respectively.

The extension region 3a of the N-type drain region, which continuously extends from the region 3, is formed between the P-type well regions 9 and an electrode as a gate electrode 17 is formed on the surfaces of the part 3a of the N-type region 3 and each part of the P-type regions 9, through a gate oxide film 15. On the other side of the N+-type substrate 1, there is provided another electrode 7 as a drain electrode.

In addition, on the gate electrode 17, there is provided a source electrode 19 through an insulated layer 21. The N+-type substrate 1, N-type drain region 3, and P-type regions 9, etc., constitute a semiconductor layer 5. With this construction, when a voltage is applied to the gate electrode 17, a conduction channel is formed on the surface of the P-type well regions 9 just below the gate oxide film 15, and current between the source and drain is controlled through this conduction channel.

In the vertical type MOS transistor according to the prior art, however, as it is used as a power MOS transistor, when a relatively high voltage is applied between the source and the drain, a breakdown begins to occur at the corner of the P-N junction indicated by an arrow 10 between the N-type drain region 3 and the Ptype well region 9 because the concentration of the electric field occurs at the corner, and then the current caused by the breakdown causes a parasitic bipolar transistor formed in parallel with the MOS transistor to be turned on. The operation of the bipolar transistor in turn causes the concentration of the current in the area between the N-type drain region 3 and the P-type well region 9 and the MOS transistor often is destroyed by the heat caused by the current.

This problem is liable to occur when a surge voltage larger than a predetermined voltage tolerance or durability of the MOS transistor is applied between the source and the drain.

SUMMARY OF THE INVENTION

It is an object of the present invention to overcome the above problem and to provide an improved vertical type MOS transistor in which even if a relatively large surge voltage is applied between the source and drain electrodes, no destruction of the transistor occurs.

It is another object of the present invention to provide an improved vertical type MOS transistor in which a Zener diode portion is formed in parallel with a MOS transistor portion in a semiconductor layer, adjacent to the transistor portion and when a surge voltage is applied to the source and drain electrodes, a breakdown occurs at the Zener diode portion or both portions and a parasitic bipolar transistor formed in parallel with the transistor portion does not turn on thereby protecting the transistor portion.

It is yet another object of the present invention to provide an improved vertical type MOS transistor chip in which the Zener diode portion or portions are formed in spaces between divided portions of the MOS transistor and in the outer periphery of each of the divided portions of the transistor.

It is yet another object of the present invention to provide an improved vertical type MOS transistor chip which can be manufactured economically without substantially increasing the size of the chip and without necessitating an external Zener diode or diodes to be attached to the chip.

One of the features of the present invention resides in a vertical type MOS transistor which comprises at least one MOS transistor portion consisting of a semiconductor layer, and a Zener diode portion formed in parallel with an adjacent to the MOS transistor portion in the semiconductor layer, the breakdown voltage of the Zener diode portion being equal or lower than that of the transistor portion, thereby current flowing in the Zener diode portion or both portions when a large surge voltage above a predetermined breakdown voltage of the Zener diode portion or the transistor portion is applied to the source and the drain electrodes.

Another feature of the present invention resides in a vertical type MOS transistor which comprises: a semiconductor layer consisting of at least one MOS transistor portion and a Zener diode portion; the MOS transistor portion having a substrate made of the first conductive type semiconductor, a first drain region formed on the substrate and made of said first conductive type semiconductor, a first well region formed by impurity diffusion in the first drain region and made of the second conductive type semiconductor, source regions made of said first conductive type semiconductor respectively, and a well contact region between the source regions and made of said second conductive type, semiconductor, each formed by impurity diffusion in the first well region from the upper surface thereof; a drain electrode provided at the bottom of the substrate; the Zener diode portion having a second well region formed by impurity diffusion in the drain region and made of the second conductive type semiconductor, and a second well contact region formed by impurity diffusion in the second well region and made of the second conductive type semiconductor; a gate electrode provided on the gate oxide film; an insulating layer provided on the gate oxide film and the gate electrode; and a source electrode formed on the insulating layer and contacted with the surfaces of the second well contact region in the second well region and the well contact region and source regions in the first well region.

A still another feature of the present invention resides in a vertical type MOS transistor chip for the MOS transistor having at least one transistor portion and one Zener diode portion wherein the Zener diode portion or portions is formed in spaces formed between divided portions of the MOS transistor and the outer periphery of each of the divided portions as well as a pad portion of the chip.

These and other objects, features and advantages of the invention will be better understood from the following detailed description of the invention with reference to the attached drawings.

DESCRIPTION OF THE PREFERRED EMBODIMENT

Figure 1:
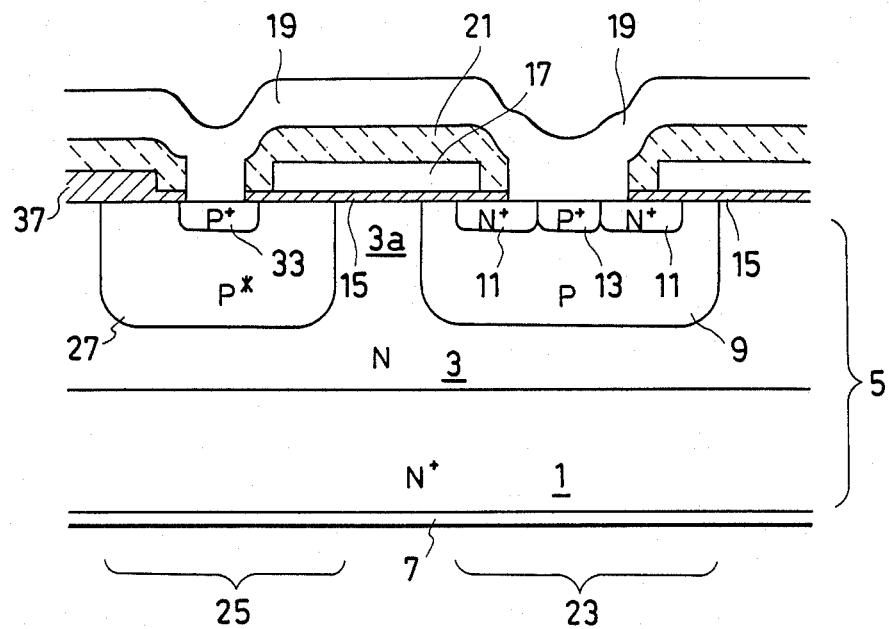
FIG. 1 illustrates a cross-sectional view of the improved vertical type MOS transistor according to one embodiment of the present invention.

FIG. 1 shows a cross-sectional view of the vertical type MOS transistor according to one embodiment of the present invention.

Figure 4:
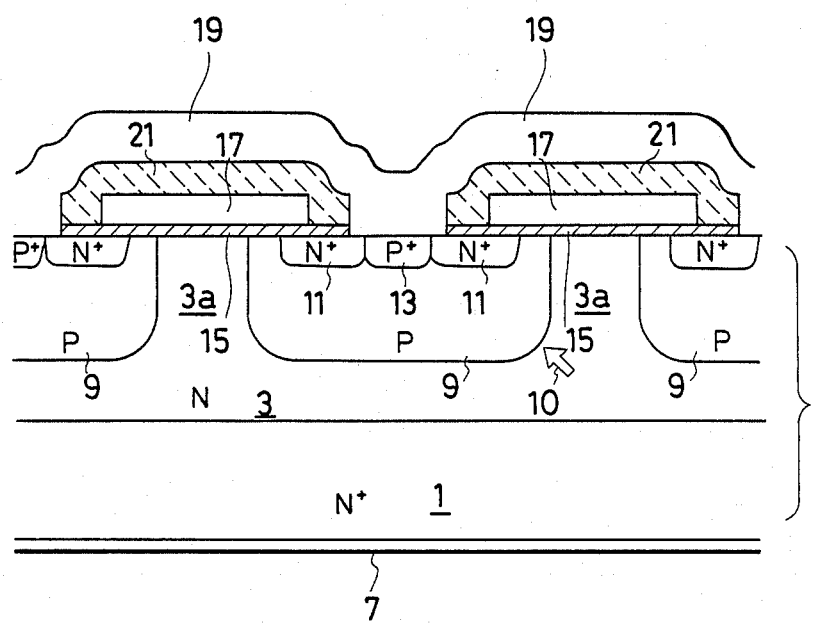
FIG. 4 illustrates a cross-sectional view of the vertical type MOS transistor according to the prior art.

The MOS transistor according to the present invention includes a transistor portion 23 and a Zener diode portion 25 which is formed adjacent to the transistor portion in parallel therewith. The transistor portion 23 has the same structure as the one according to the prior art as shown in FIG. 4, with the same reference numerals attached to the corresponding elements in FIG. 1.

The Zener diode portion 25 is constructed such that when a high voltage such as a surge voltage is applied to the source electrode and the drain electrode, a breakdown occurs at the Zener diode portion 25 against the high voltage, so as to prevent the high voltage from being applied to the transistor portion 23 between the same source and drain electrodes.

The Zener diode portion 25 comprises a P*-type well region 27 formed by impurity diffusion in the N-type drain region 3 similar to the P-type region 9 of the MOS transistor portion 23. However, the impurity concentration of the P*-type well region 27 is higher than that of the P-type well region 9. With in the P*-type region 27, there is formed a $P^{30}$-type well contact region 33. In this case, the P*-type well region 27 is connected to the source electrode 19 through the P-type diffused region 33. However, it may also be constructed in such a manner that the P*-type well region 27 is directly connected to the source electrode 19 without the P+-type region 33. Reference numeral 37 indicates a field oxide film.

The P-N junction of the N-type region 3 and the P*-type region 27 of the Zener diode portion 25 is formed in parallel with the P-N junction of the N-type region 3 and the P-type region 9 of the transistor portion 23. Since the impurity concentration of the P*-type region 27 is higher than that of the P-type region 9, the breakdown voltage of the P-N junction of the Zener diode portion 25 becomes lower than that of the MOS transistor portion 23.

Consequently, in operation when a high surge voltage is applied to the source electrode 19 and the drain electrode 7, a breakdown occurs at the P-N junction of the Zener diode portion 25 prior to that of the transistor portion 23. Consequently, the transistor portion 23 is protected from the high surge voltage. Namely, the Zener diode current flows first through the P-n junction between the P-type region 27 and the N-type region 3, so that no current flows through the MOS transistor portion 23. As a result, any breakdown condition otherwise encountered in the vertical type MOS transistor according to the prior art can be avoided in the present invention. In this case, the junction capacity of the Zener diode portion 25 is thermally determined as in the case of normal Zener diode.

Since the durability against surge voltage in the P-N junction of the Zener diode portion 25 is larger than that of the MOS transistor, the Zener diode portion 25 can not easily be destroyed or broken down by the Zener current.

Figure 2:
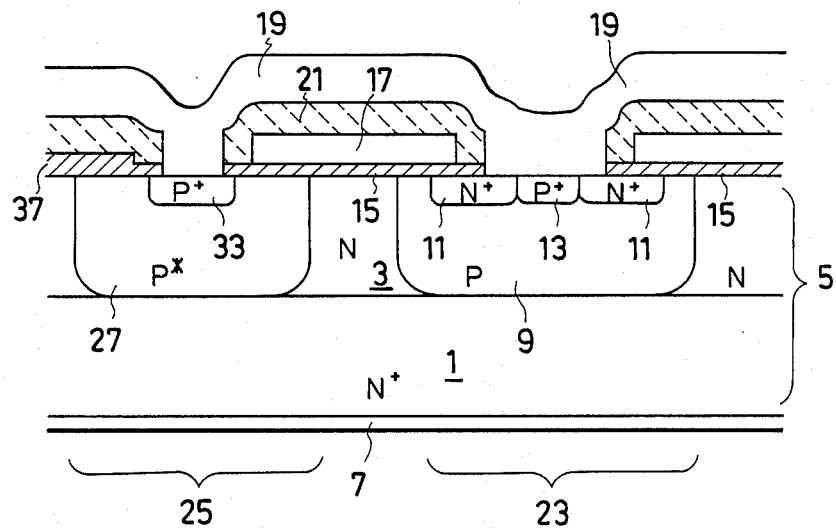
FIG. 2 illustrates a cross-sectional view of the improved vertical type MOS transistor of another embodiment according to the present invention.

FIG. 2 shows another embodiment of the vertical type MOS transistor according to the present invention.

The structure of this embodiment in FIG. 2 is almost same as that of FIG. 1 except for the structural difference in the N-type drain region. Namely, in FIG. 2, the bottoms of each of the P*-type region 27 and P-type region 9 extend downwards until they contact the upper surface of the N+-type substrate 1 respectively. The P-N junction in this case is formed between the P-type region 27 and the N+-type substrate 1, as the region 27 and the substrate 1 contact each other as well as between the region 9 and the substrate 1.

With this construction, the concentration of the electric field in the corners of the P-type well region 9 in the MOS transistor such as indicated in Japanese Patent Disclosure No. 59-98557/1984 can be prevented.

In this configuration, the breakdown current is to flow uniformly from the drain region 1 to the P-well region 9. The result therefrom is that the parasitic bipolar transistor which is connected in parallel to the MOS transistor is unlikely to be turned on. Therefore, this structure realizes a transistor having a high surge capacity.

Even with the MOS transistor portion 23 alone, a somewhat large surge capacity may be observed. The P-well region 9 occupies, however, less than 20% of the entire chip area and this is inefficient. Contrary to this the structure with a high surge capacity can be configured by forming the zener diode portion 25 in parallel as shown in FIG. 2. Namely different from the MOS transistor portion 23, the diode portion 25 is not limited to forming a gate electrode and the occupying rate in area of the P-well region 27 may be almost 100%.

Needless to say, in this structure the impurity concentrations of the P-well regions 9 and 27 must be chosen to take the same value so that the breakdown currents that flow through the Zener diode portion 25 and the MOS transistor portion 23 are the same in magnitude.

In the foregoing embodiment, the description has been directed to the N-type channel MOS transistor, but it is apparent that the present invention is applicable to the P-type channel MOS transistor as well.

Figure 3:
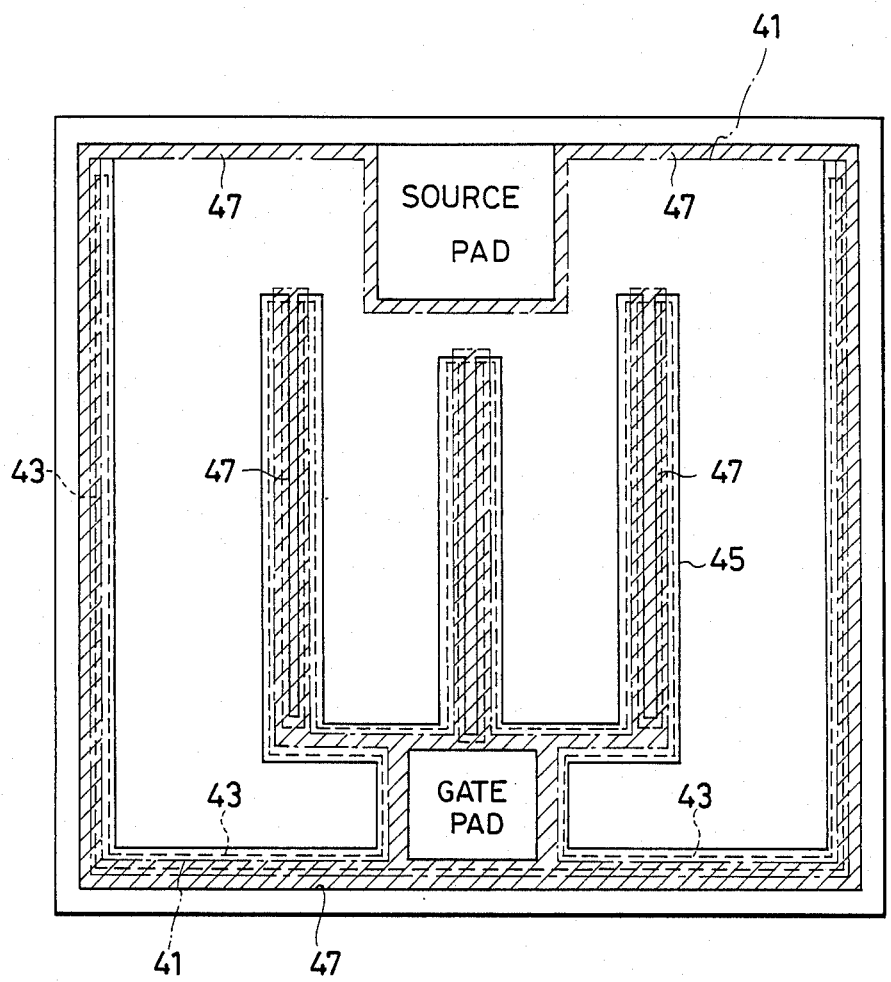
FIG. 3 illustrates an overall layout construction of the vertical type MOS transistor chip of FIGS. 1 and FIG. 2, according to the present invention.

FIG. 3 shows a chip layout of the vertical type MOS transistor shown in FIG. 1 or FIG. 2, according to the present invention. In FIG. 3, the portions surrounded by the dot-dashed lines 41 indicate the MOS transistor portions, the elongated portions surrounded by the dotted lines 43 indicate gate contact aluminum wirings, while the portions surrounded by the solid lines 45 indicate the source electrode and Zener diode aluminum wirings, and the hatched line portions 47 indicate the Zener diode portions between the source and drain electrodes.

In general, in order to reduce the gate resistance in the MOS transistor portions 23, it is necessary to divide the vertical type MOS transistor into a plurality of portions and to provide each of gate contact aluminum wirings thereto. However, it is normal that spaces are produced in the divided portions. Accordingly, if the Zener diode portion or portions are formed in the spaces in the divided portions as well as the outer periphery of each of the divided portions of the MOS transistor, the chip size of the vertical type MOS transistor can almost be maintained in the same size without the Zener diode portion or portions. consequently, in the embodiment shown in FIG. 3 according to the present invention, all of the Zener diode portions are formed in the spaces of the chip as shown by the hatched line portions 47. Of course, it is apparent that the Zener diode portion may be also be formed within a source pad.

As described in the foregoing embodiment, the vertical type MOS transistor according to the present invention has at least one MOS transistor portion and further comprises a Zener diode portion formed in parallel with the MOS transistor portion in the semiconductor layer, adjacent to. The transistor portion, the breakdown voltage of the P-N junction of the diode portion is equal or lower than that of the P-N junction of the transistor portion, thereby a breakdown occuring at the Zener diode portion or both portions when an excessively large surge voltage is applied to the MOS transistor. The surge current flows through the Zener diode portion or both portions in the semiconductor layer and then a parasitic bipolar transistor formed in parallel with the transistor portion does not turn on. Thus, the transistor portion is protected from being destroyed or broken down by the concentration of the breakdown current.

Moreover, since at least one Zener diode portion is provided for each or a plurality of transistor portions in a limited space of the MOS transistor chip according to the present invention, it is no longer necessary to externally provide any Zener diode or diodes for protecting the MOS transistor portions in the chip, thus enabling the chip to be manufactured economically without increasing the size of the chip.

While the invention has been described in its preferred embodiments, it is to be understood that the words which have been used are words of description rather than limitation and that various changes and modification may be made within the purview of the appended claims without departing from the true scope and spirit of the invention in its broader aspects.

What is claimed is:

1. A vertical type MOSFET comprising:
   a first conductivity type drain region formed on a substrate;
   a first well region of a second conductivity type formed within the drain region;
   a source region of the first conductivity type formed within the first well region so as to define a gate-controlled channel between the drain region and the source region, the source region, the first well region and the drain region forming a transistor cell;
   a second well region of the second conductivity type having a higher impurity concentration than that of the first well region formed within the drain region along a peripheral portion of the transistor cell, the second well region being electrically connected to the source region, the second well region and the drain region forming a zener diode section which is provided electrically in parallel to the transistor cell;
   wherein the transistor cell forms a power MOS section of comb shape and the zener diode section is formed at a gap in the comb shape which is not occupied by the power MOS section; and
   wherein an electrical current flows through the zener diode section rather than through the transistor cell when a surge voltage is applied to the MOSFET.

2. A vertical type MOSFET comprising:
   a substrate comprising first and second layers, the first layer comprising a first conductivity type drain region and having a major surface thereon, and the second layer having the same conductivity type as and a higher impurity concentration than that of the first layer;
   a first well region of a second conductivity type formed within the drain region at the major surface;
   a source region of the first conductivity type formed within the first well region so as to define a gate-controlled channel between the drain region and the source region at the major surface, the source region, the first well region and the drain region forming a transistor cell;
   a second well region of the second conductivity type having an impurity concentration equal to or higher than that of the first well region and formed within the drain along a peripheral portion of the transistor cell to contact with the second layer of the substrate; the second well region being electrically connected in parallel to the source region, the second well region and the second layer of the substrate forming a zener diode section which is provided electrically in parallel to the transistor cell;
   wherein the transistor cell forms a power MOS section of comb shape and the zener diode section is formed at a gap in the comb shape which is not occupied by the power MOS section; and
   wherein an electrical current flows through the zener diode section rather than through the transistor cell when a surge voltage is applied to the MOSFET.

3. A vertical type MOSFET comprising:
   a substrate having a first layer with a major surface thereon and a second layer having the same conductivity type as and a higher impurity concentration than that of the first layer a portion of the first and second layers comprising a drain region;
   a first well region of a second conductivity type formed within the first layer to contact with the second layer;
   a source region of the first conductivity type formed within the first well region so as to define a gate-controlled channel between the drain region and the source region at the major surface, the source region, the first well region and the drain region forming a transistor cell, a second well region of the second conductivity type having an impurity concentration equal to or higher than that of the first well region and formed within the first layer adjacent to the transistor cell to contact with the second layer, the second well region being electrically connected to the source region and the second well region and the second layer of the substrate forming a zener diode section which is positioned in parallel to the transistor cell across the substrate;

wherein the transistor cell forms a power MOS section of comb shape and the zener diode section is formed at a gap in the comb shape which is not occupied by the power MOS section and the MOSFET has an improved surge current capacity.

* * * * *